(12) United States Patent
Wu et al.

(10) Patent No.: US 10,824,214 B2
(45) Date of Patent: Nov. 3, 2020

(54) SYSTEMS AND METHODS FOR MAXIMIZING MULTI-PHASE VOLTAGE REGULATOR EFFICIENCY USING OPERATIONAL MODES IN WHICH PHASES OPERATE IN FULLY-ENABLED MODE AND LIGHT-LOAD MODE

(71) Applicant: Dell Products L.P., Round Rock, TX (US)

(72) Inventors: Feng-Yu Wu, Taipei (TW); Shiguo Luo, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 320 days.

(21) Appl. No.: 15/911,459

(22) Filed: Mar. 5, 2018

(65) Prior Publication Data

US 2019/0272015 A1    Sep. 5, 2019

(51) Int. Cl.
*H02M 3/158*        (2006.01)
*G06F 1/3209*       (2019.01)
*G11C 5/14*         (2006.01)
*G06F 1/02*         (2006.01)
*G05F 1/575*        (2006.01)
*H02M 1/00*         (2006.01)

(52) U.S. Cl.
CPC .......... *G06F 1/3209* (2013.01); *G05F 1/575* (2013.01); *G06F 1/022* (2013.01); *G11C 5/148* (2013.01); *H02M 3/1584* (2013.01); *H02M 2001/0032* (2013.01)

(58) Field of Classification Search
CPC ............... H02M 3/1584; H02M 3/158; H02M 2001/0032

USPC .......................................... 323/272–289, 315
See application file for complete search history.

(56) References Cited

U.S. PATENT DOCUMENTS

| | | | | |
|---|---|---|---|---|
| 5,343,381 A * | 8/1994 | Bolduc | .................. | H02H 9/007 307/105 |
| 7,615,973 B2 * | 11/2009 | Uehara | .................... | G06G 7/14 323/224 |
| 7,999,520 B2 * | 8/2011 | Luo | ......................... | H02J 1/102 323/267 |
| 8,004,263 B2 * | 8/2011 | Hirata | ................... | H02M 3/156 323/285 |
| 8,451,153 B1 * | 5/2013 | Lakshmikanthan | ........................ | G01R 19/0092 341/120 |
| 8,917,074 B2 * | 12/2014 | Luo | ..................... | H02M 3/1588 323/284 |

(Continued)

*Primary Examiner* — Thienvu V Tran
*Assistant Examiner* — Nusrat Quddus
(74) *Attorney, Agent, or Firm* — Jackson Walker L.L.P.

(57) ABSTRACT

A method may include operating a power system coupled to at least one information handling resource, configured to provide electrical energy to the at least one information handling resource, and comprising a plurality of voltage regulator phases, in a plurality of operational modes, each mode defining a number of the plurality of voltage regulator phases operating in a fully-enabled mode and whether or not one of the plurality of voltage regulator phases operates in a light-load mode, selecting a selected operational mode from the plurality of operational modes based on a load requirement of the at least one information handling resource, and controlling the plurality of voltage regulator phases to deliver an aggregate current in accordance with the load requirement and the selected operational mode.

21 Claims, 7 Drawing Sheets

(56) References Cited

U.S. PATENT DOCUMENTS

| | | | | |
|---|---|---|---|---|
| 8,994,346 | B2* | 3/2015 | Rahardjo | H02M 3/156 323/267 |
| 9,857,854 | B2* | 1/2018 | Zhang | G06F 1/26 |
| 10,116,212 | B2* | 10/2018 | Luo | H02M 3/158 |
| 2002/0057082 | A1* | 5/2002 | Hwang | H02M 3/158 323/284 |
| 2009/0146635 | A1* | 6/2009 | Qiu | H02M 3/156 323/290 |
| 2009/0256535 | A1* | 10/2009 | Houston | H02M 3/1584 323/262 |
| 2013/0027009 | A1* | 1/2013 | Tang | H02M 3/1584 323/271 |
| 2014/0103718 | A1* | 4/2014 | Lee | H01F 27/255 307/31 |
| 2014/0125306 | A1* | 5/2014 | Babazadeh | G05F 5/00 323/285 |
| 2015/0002112 | A1* | 1/2015 | Tang | G01R 31/42 323/271 |
| 2015/0113294 | A1* | 4/2015 | Zhang | H02M 3/158 713/300 |
| 2015/0370295 | A1* | 12/2015 | Luo | H02M 3/157 713/330 |
| 2016/0094122 | A1* | 3/2016 | Luo | H02M 3/1584 323/285 |
| 2016/0116549 | A1* | 4/2016 | Mathew | H02M 3/1584 702/60 |
| 2016/0261186 | A1* | 9/2016 | Jiang | H02M 3/157 |

* cited by examiner

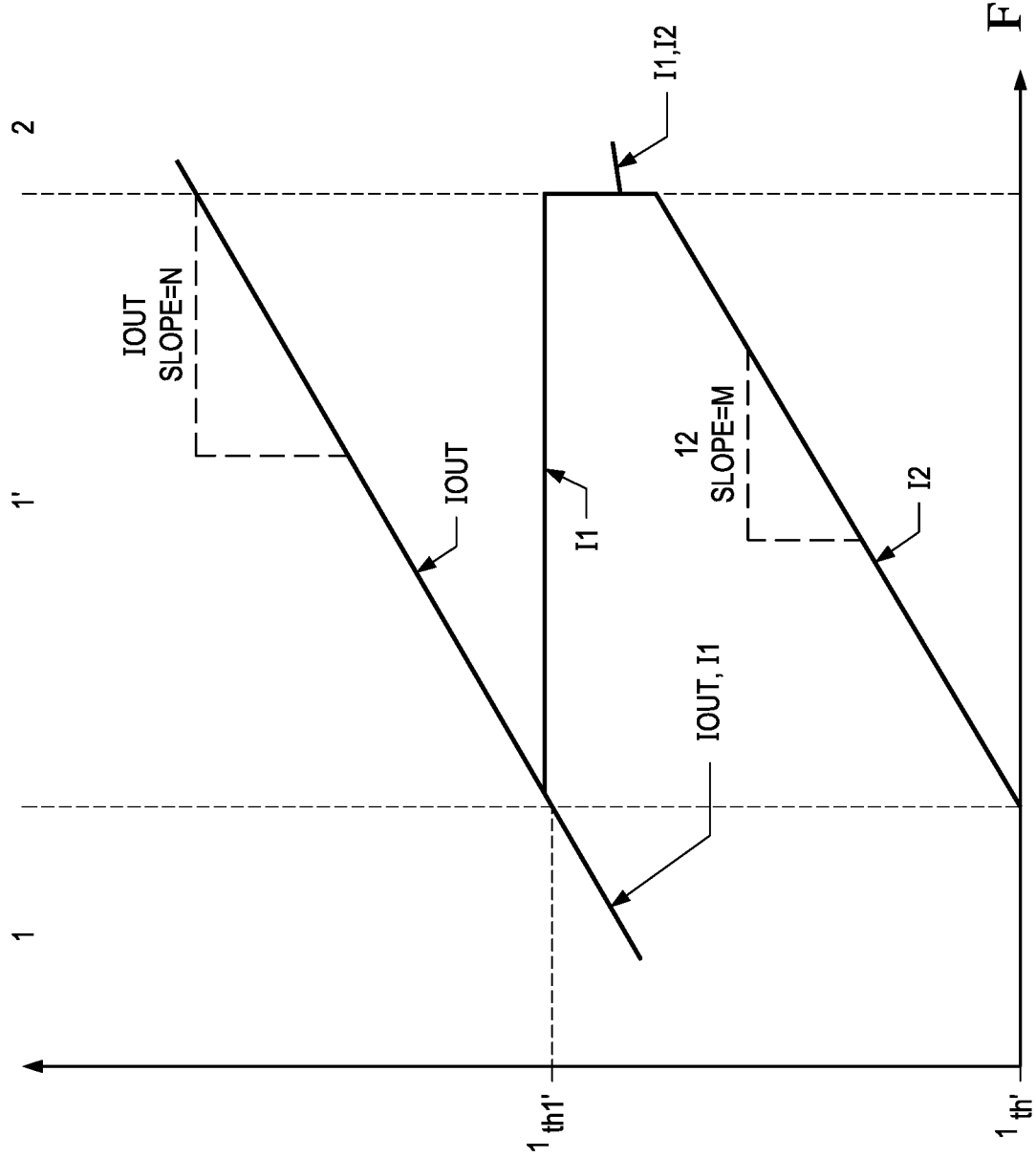

SYSTEMS AND METHODS FOR MAXIMIZING MULTI-PHASE VOLTAGE REGULATOR EFFICIENCY USING OPERATIONAL MODES IN WHICH PHASES OPERATE IN FULLY-ENABLED MODE AND LIGHT-LOAD MODE

TECHNICAL FIELD

The present disclosure relates in general to information handling systems, and more particularly to managing a multi-phase voltage regulator in an information handling system to maximize regulator power efficiency.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include a voltage regulator to provide a constant voltage level and a current to power the system. For example, a voltage regulator may receive an input voltage and produce an output current at a predetermined output voltage required by a load, i.e., the circuit element(s) for which it is providing power. Moreover, modern information handling systems may include components that maintain current requirements across a broad range from relatively high peak currents to very low stable currents. More particularly, voltage regulators may be required to maintain a high efficiency, or low power loss, over such ranges. In particular, a direct current to direct current (DC-DC) voltage regulator may include a controller, one or more drivers, and one or more power stages. Furthermore, a power stage may include one or more metal-oxide-semiconductor-field-effect-transistors (MOSFETs), which may be driven by the drivers.

Additionally, some voltage regulators may be capable of operating in multiple phases. To this end, the concept of a phase for a voltage regulator may typically refer to combining a driver and a power stage to form one phase. Thus, a multi-phase voltage regulator may include multiple instances of such combinations. Alternatively, a multi-phase voltage regulator may be thought of as a combination of single phase voltage regulators. For example, a multi-phase voltage regulator may include a plurality of single phase voltage regulators coupled in parallel to provide varying ranges of output current. During periods of high loads, the multi-phase voltage regulator may function with all phases in operation. In contrast, for lower loads, it may employ phase-shedding and operate with a reduced number of phases.

While phase shedding often provides higher power efficiency than operation with all phases, power efficiency improvements over existing phase shedding approaches remain desirable.

SUMMARY

In accordance with the teachings of the present disclosure, the disadvantages and problems associated with power dissipation in a voltage regulator have been reduced or eliminated.

In accordance with embodiments of the present disclosure, an information handling system may include at least one information handling resource and a power system coupled to the at least one information handling resource, configured to provide electrical energy to the at least one information handling resource, and comprising a plurality of voltage regulator phases. The power system may further be configured to operate in a plurality of operational modes, each mode defining a number of the plurality of voltage regulator phases operating in a fully-enabled mode and whether or not one of the plurality of voltage regulator phases operates in a light-load mode, select a selected operational mode from the plurality of operational modes based on a load requirement of the at least one information handling resource, and control the plurality of voltage regulator phases to deliver an aggregate current in accordance with the load requirement and the selected operational mode. At least one of the plurality of operational modes comprises a mode in which one of the plurality of voltage regulator phases operates in a light-load mode and at least one of the plurality of voltage regulator phases operates in a fully-enabled mode. A first current delivered by the voltage regulator phases operating in the light-load mode is smaller in magnitude than a second current delivered by an individual voltage regulator phase operating in the fully-enabled mode.

In accordance with these and other embodiments of the present disclosure, a method may include operating a power system coupled to at least one information handling resource, configured to provide electrical energy to the at least one information handling resource, and comprising a plurality of voltage regulator phases, in a plurality of operational modes, each mode defining a number of the plurality of voltage regulator phases operating in a fully-enabled mode and whether or not one of the plurality of voltage regulator phases operates in a light-load mode, selecting a selected operational mode from the plurality of operational modes based on a load requirement of the at least one information handling resource, and controlling the plurality of voltage regulator phases to deliver an aggregate current in accordance with the load requirement and the selected operational mode. At least one of the plurality of operational modes comprises a mode in which one of the plurality of voltage regulator phases operates in a light-load mode and at least one of the plurality of voltage regulator phases operates in a fully-enabled mode. A first current delivered by the voltage regulator phases operating in the light-load mode is smaller in magnitude than a second current delivered by an individual voltage regulator phase operating in the fully-enabled mode.

In accordance with these and other embodiments of the present disclosure, a power system may include a plurality of voltage regulator phases configured to, in the aggregate, deliver an aggregate current in accordance with a load requirement and a controller configured to operate the power system in a plurality of operational modes, each mode defining a number of the plurality of voltage regulator phases operating in a fully-enabled mode and whether or not one of the plurality of voltage regulator phases operates in a light-load mode, select a selected operational mode from the plurality of operational modes based on the load requirement, and control the plurality of voltage regulator phases to deliver an aggregate current in accordance with the load requirement and the selected operational mode. At least one of the plurality of operational modes comprises a mode in which one of the plurality of voltage regulator phases operates in a light-load mode and at least one of the plurality of voltage regulator phases operates in a fully-enabled mode. A first current delivered by the voltage regulator phases operating in the light-load mode is smaller in magnitude than a second current delivered by an individual voltage regulator phase operating in the fully-enabled mode.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIGS. 4A and 4B illustrate example currents generated by individual voltage regulator phases for various operational modes of a power system, in accordance with embodiments of the present disclosure.

DETAILED DESCRIPTION

Preferred embodiments and their advantages are best understood by reference to FIGS. 1 through 5B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), busses, memories, I/O devices and/or interfaces, storage resources, network interfaces, motherboards, power supplies, air movers (e.g., fans and blowers) and/or any other components and/or elements of an information handling system.

Figure 1:
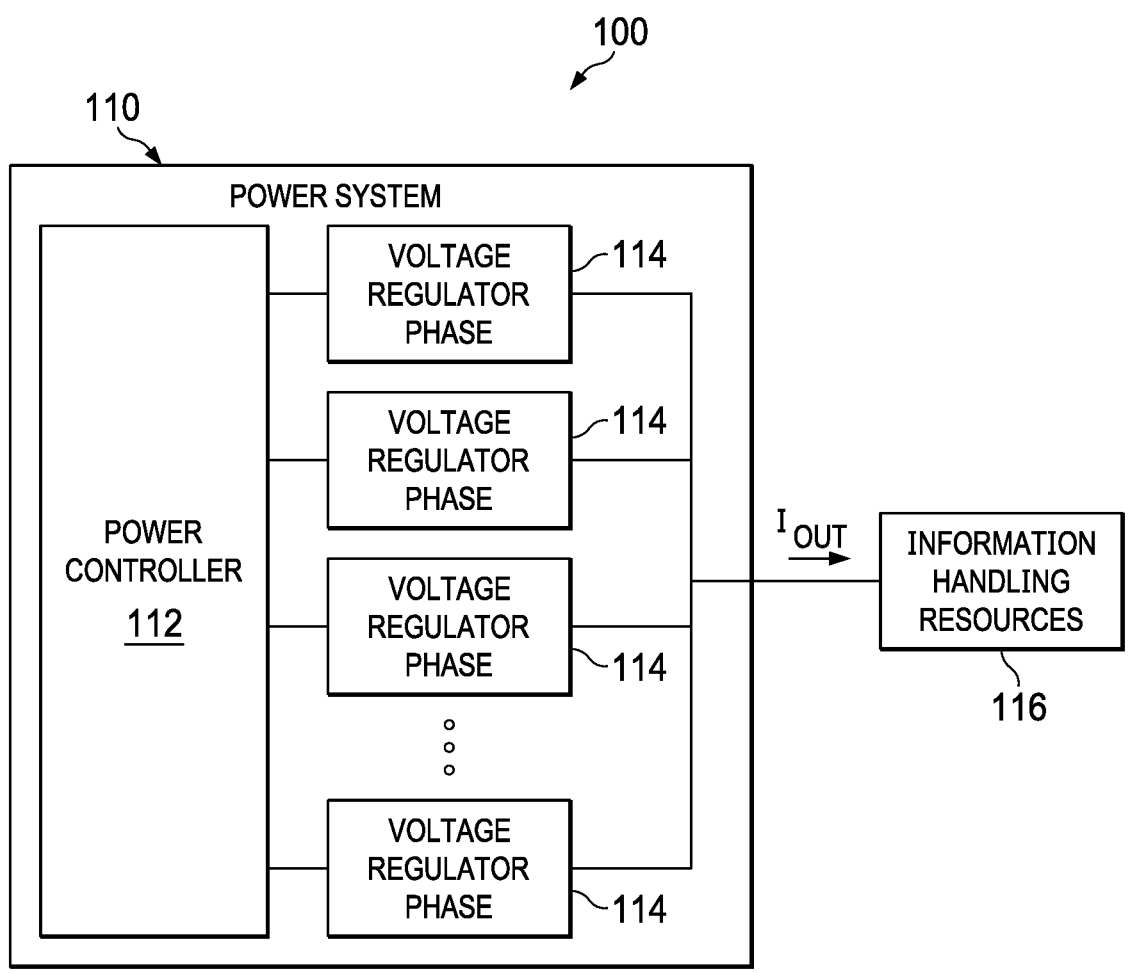
FIG. 1 illustrates a block diagram of an example of an information handling system, in accordance with embodiments of the present disclosure.

FIG. 1 illustrates a block diagram of an example of an information handling system 100 incorporating a power system 110 in accordance with an embodiment of the present disclosure. As depicted, information handling system 100 may include a power system 110, and one or more other information handling resources 116.

Generally speaking, power system 110 may include any system, device, or apparatus configured to supply electrical current to one or more information handling resources 116. In some embodiments, power system 110 may include a multi-phase voltage regulator.

Power system 110 may include a power controller 112 and a plurality of voltage regulator phases 114. Power controller 112 may include any system, device, or apparatus configured to control the output of power system 110 and/or selectively enable and disable voltage regulator phases 114. The enabling and disabling of voltage regulator phases 114 is described in greater detail below.

Each voltage regulator phase 114 may include any system, device, or apparatus configured to supply a portion of the total current output $I_{OUT}$ of power system 110. In embodiments in which power system 110 is a multi-phase voltage regulator, a voltage regulator phase 114 may comprise a phase of the voltage regulator.

Figure 2:
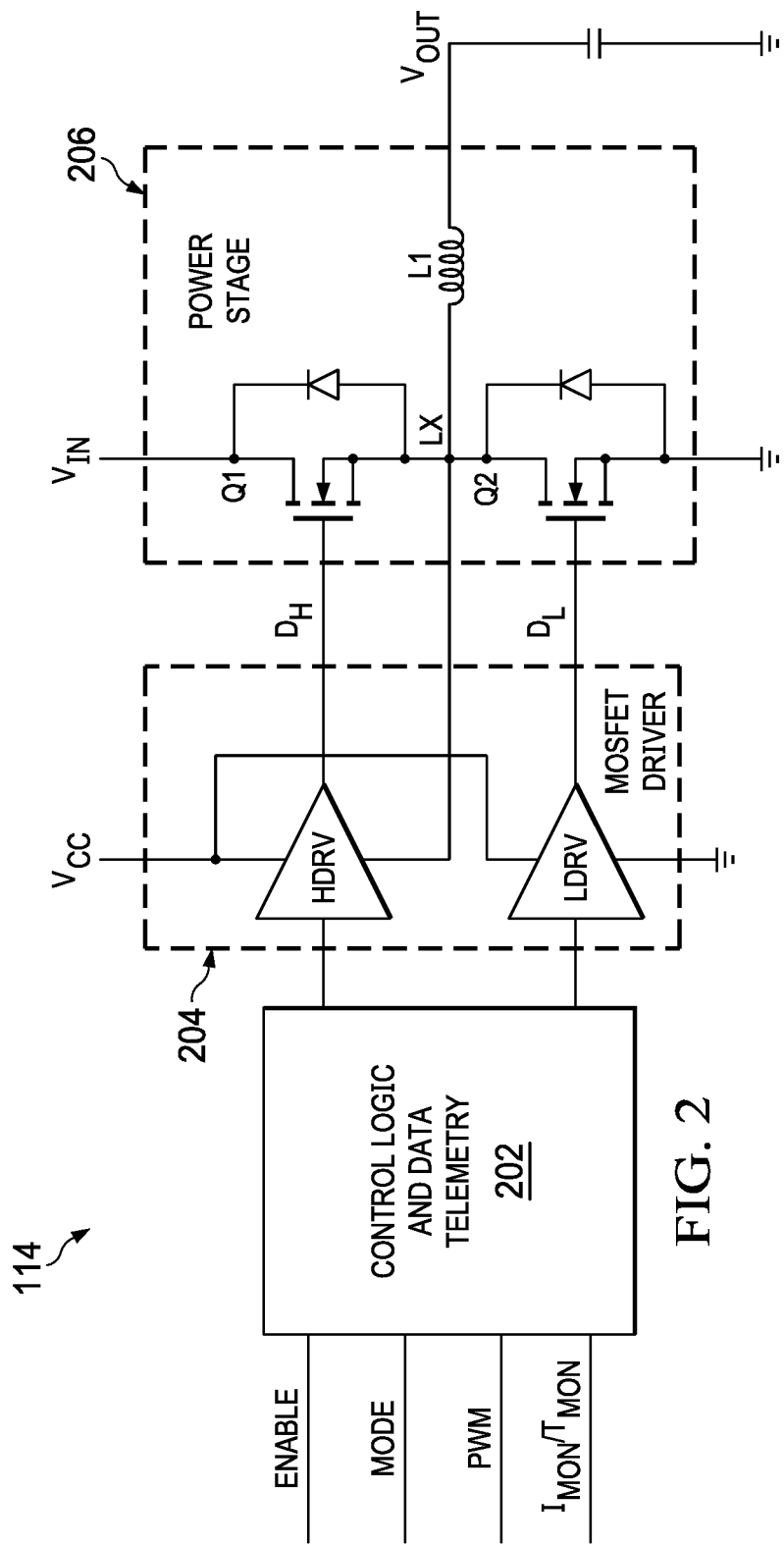
FIG. 2 illustrates a block diagram of an example voltage regulator, in accordance with embodiments of the present disclosure.

Turning briefly to FIG. 2, FIG. 2 illustrates a block diagram of an example voltage regulator phase 114, in accordance with embodiments of the present disclosure. In a multi-phase voltage regulation system, voltage regulator phase 114 depicted in FIG. 2 may represent a single phase of the multi-phase system. Voltage regulator phase 114 may comprise a control logic and data telemetry 202, a MOSFET driver 204, and a power stage 206. Control logic and data telemetry 202 may comprise any system, device, or apparatus for controlling a high-side driver HDRV and low-side driver LDRV of MOSFET driver 204 based on input signals received by control logic and data telemetry 202. Such input signals may comprise an enabling signal ENABLE which indicates whether the phase represented by voltage regulator phase 114 is enabled or disabled, a mode signal MODE which indicates whether the voltage regulator phase 114 is to, when enabled, operate in a fully-enabled mode or a light-load mode, a pulse-width modulation input signal PWM indicating desired output parameters of a voltage regulator output voltage $V_{OUT}$, and one or more telemetry signals (e.g., a current monitoring signal $I_{mon}$ or a temperature monitoring signal $T_{mon}$). In some embodiments, one or more of inputs PWM, ENABLE, and MODE may be combined into a single input capable of receiving a signal (e.g., a pulse-width modulation signal) in which information for each of PWM, ENABLE, and MODE is encoded.

MOSFET driver 204 may include high-side driver HDRV and low-side driver LDRV. High-side driver HDRV may generate an output voltage $D_H$ that regulates current through high-side switch Q1 of power stage 206. Similarly, low-side driver LDRV may generate an output voltage $D_L$ that regulates current through low-side switch Q2 of power stage 206. In operation, control logic and data telemetry 202 may, based on various received control signals, control high-side driver HDRV and low-side driver LDRV.

Power stage 206 may comprise a high-side switch Q1, low-side switch Q2, and output inductor L1. High-side switch Q1 may comprise any suitable switching device (e.g., a metal-oxide-semiconductor field-effect transistor or "MOSFET") located between a positive terminal of a power supply $V_{IN}$ and phase node LX, while low-side switch Q2 may comprise any suitable switching device (e.g., a MOSFET) located between phase node LX and a negative terminal of the power supply or ground. The phase node voltage LX may be generated based on the supply voltage $V_{IN}$ and switching of switches Q1 and Q2. Power stage 206 may also comprise an output inductor L1 between the phase node and the output of the voltage regulator, which may serve to boost or reduce supply voltage $V_{IN}$ to generate output voltage $V_{OUT}$ such that voltage regulator phase 114 functions as a direct-current to direct-current voltage converter.

Returning to FIG. 1, generally speaking, information handling resources 116 may include any component system, device or apparatus of information handling system 100, including without limitation processors, buses, computer-readable media, input-output devices and/or interfaces, storage resources, network interfaces, motherboards, electromechanical devices (e.g., fans), displays, and/or power supplies.

In operation, power controller 112 may selectively enable and disable one or more voltage regulator phases 114 in response to an electrical current requirement of information handling resources, such that one or more phases may be shed to reduce power consumption of power system 110 in response to the reduced current requirement, and thus increase power efficiency of information handling system 100. In addition, each of voltage regulator phases 114 may be configured to operate in three modes: a disabled mode, a light-load mode, and a fully-enabled mode, and power controller 112 may be able to selectively control the operational modes of each of voltage regulator phases 114.

In the disabled mode, a voltage regulator phase 114 is disabled from generating current. In the fully-enabled mode, a voltage regulator phase 114 may operate such that MOSFET driver 204 outputs a pulse-width modulated waveform on output voltages $D_H$ and $D_L$, wherein the pulse width of the waveform generated defines a current to be generated by the voltage regulator phase 114. In the light-load mode, a voltage regulator phase 114 may operate such that MOSFET driver 204 outputs a pulse-frequency modulated waveform on output voltages $D_H$ and $D_L$, wherein the pulse frequency of the waveform generated defines a current to be generated by the voltage regulator phase 114.

In operation, power controller 112 may control voltage regulator phases 114 such that at any given time, no more than one voltage regulator phase 114 operates in the light-load mode. Further, in some instances, for a given requirement for output current $I_{OUT}$, no voltage regulator phases will operate in the light-load mode. Accordingly, power system 110 may operate in a plurality of modes, each mode defined by the number of voltage regulator phases 114 enabled, and whether one of such voltage regulator phases 114 is operating in the light-load mode. Below is a table depicting example operating modes of power system 110 having five voltage regulator phases 114, in accordance with embodiments of the present disclosure.

| Mode | Condition | Fully Enabled | Light-Load Enabled |
|---|---|---|---|
| 0 | $I_{OUT} = 0$ | 0 | 0 |
| 0' | $0 < I_{OUT} < I_{th1}$ | 0 | 1 |
| 1 | $I_{th1} \leq I_{OUT} < I_{th1'}$ | 1 | 0 |
| 1' | $I_{th1'} \leq I_{OUT} < I_{th2}$ | 1 | 1 |
| 2 | $I_{th2} \leq I_{OUT} < I_{th2'}$ | 2 | 0 |
| 2' | $I_{th2'} \leq I_{OUT} < I_{th3}$ | 2 | 1 |
| 3 | $I_{th3} \leq I_{OUT} < I_{th3'}$ | 3 | 0 |
| 3' | $I_{th3'} \leq I_{OUT} < I_{th4}$ | 3 | 1 |
| 4 | $I_{th4} \leq I_{OUT} < I_{th4'}$ | 4 | 0 |
| 4' | $I_{th4'} \leq I_{OUT} < I_{th5}$ | 4 | 1 |
| 5 | $I_{OUT} \geq I_{th5}$ | 5 | 0 |

Thus, as shown based in the table above, an operational mode of power system 110 may be selected based on the output current $I_{OUT}$ to be generated by power system 110 and its magnitude in comparison to a plurality of threshold current values $I_{th1}, I_{th1'}, I_{th2}, I_{th2'}, I_{th3}, I_{th3'}, I_{th4}, I_{th4'}$, and $I_{th5}$, wherein $0 < I_{th1} < I_{th1'} < I_{th2} < I_{th2'} < I_{th3} < I_{th3'} < Ith_4 < I_{th4'} < I_{th5}$.

In operation, all fully-enabled voltage regulator phases 114 may generate approximately the same current. However, when a voltage regulator phase 114 is light-load enabled, it may generate a current which is less than a current generated by a fully-enabled voltage regulator phase 114. This concept is better illustrated in reference to the figures described below.

Figure 3:
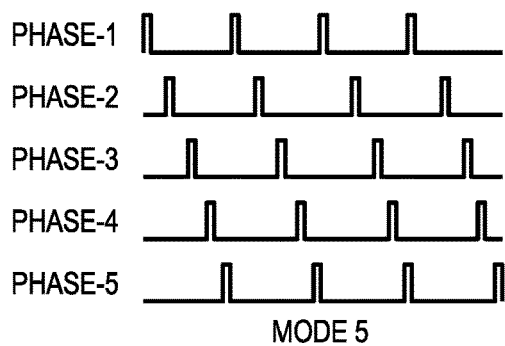
FIG. 3 illustrates example waveforms generated by driver stages of individual voltage regulator phases for various operational modes of a power system, in accordance with embodiments of the present disclosure.

FIG. 3 illustrates example waveforms generated by driver stages 202 of individual voltage regulator phases 114 for various operational modes of power system 110 shown in the example of the table above, in accordance with embodiments of the present disclosure. For example, as shown in FIG. 3, in operational mode 5 of power system 110 as shown in the table above, all five voltage regulator phases 114 may be fully enabled such that their respective driver stages 202 generate pulse-width modulated waveforms of approximately equal pulse width, such that the respective currents generated by all five voltage regulator phases 114 are approximately equal.

In operational modes 4' and 4 of power system 110 as shown in the table above, four voltage regulator phases 114 may be fully enabled such that their respective driver stages 202 generate pulse-width modulated waveforms of approximately equal pulse width, such that the respective currents generated by the four fully-enabled voltage regulator phases 114 are approximately equal. However, in operational mode 4', one of the voltage regulator phases 114 (e.g., labeled Phase-5 in FIG. 3) may be enabled in the light-load mode, such that its respective driver stage 202 generates a pulse-frequency modulated waveform, such that the current generated by the light-load enabled voltage regulator phase 114 is less than that of a fully-enabled voltage regulator phase 114.

In operational modes 3' and 3 of power system 110 as shown in the table above, three voltage regulator phases 114 may be fully enabled such that their respective driver stages 202 generate pulse-width modulated waveforms of approximately equal pulse width, such that the respective currents generated by the three fully-enabled voltage regulator phases 114 are approximately equal. However, in operational mode 3', one of the voltage regulator phases 114 (e.g., labeled Phase-4 in FIG. 3) may be enabled in the light-load mode, such that its respective driver stage 202 generates a pulse-frequency modulated waveform, such that the current generated by the light-load enabled voltage regulator phase 114 is less than that of a fully-enabled voltage regulator phase 114.

In operational modes 2' and 2 of power system 110 as shown in the table above, two voltage regulator phases 114 may be fully enabled such that their respective driver stages 202 generate pulse-width modulated waveforms of approximately equal pulse width, such that the respective currents generated by the two fully-enabled voltage regulator phases 114 are approximately equal. However, in operational mode 2', one of the voltage regulator phases 114 (e.g., labeled Phase-3 in FIG. 3) may be enabled in the light-load mode, such that its respective driver stage 202 generates a pulse-frequency modulated waveform, such that the current generated by the light-load enabled voltage regulator phase 114 is less than that of a fully-enabled voltage regulator phase 114.

In operational modes 1' and 1 of power system 110 as shown in the table above, one voltage regulator phase 114 may be fully enabled such that its respective driver stage 202 generates a pulse-width modulated waveform. However, in operational mode 1', one of the voltage regulator phases 114 (e.g., labeled Phase-2 in FIG. 3) may be enabled in the light-load mode, such that its respective driver stage 202 generates a pulse-frequency modulated waveform, such that the current generated by the light-load enabled voltage regulator phase 114 is less than that of the fully-enabled voltage regulator phase 114.

In operational mode 0' of power system 110 as shown in the table above, no voltage regulator phases 114 may be fully enabled. However, in operational mode 0', one of the voltage regulator phases 114 (e.g., labeled Phase-1 in FIG. 3) may be enabled in the light-load mode, such that its respective driver stage 202 generates a pulse-frequency modulated waveform.

Figure 4A:
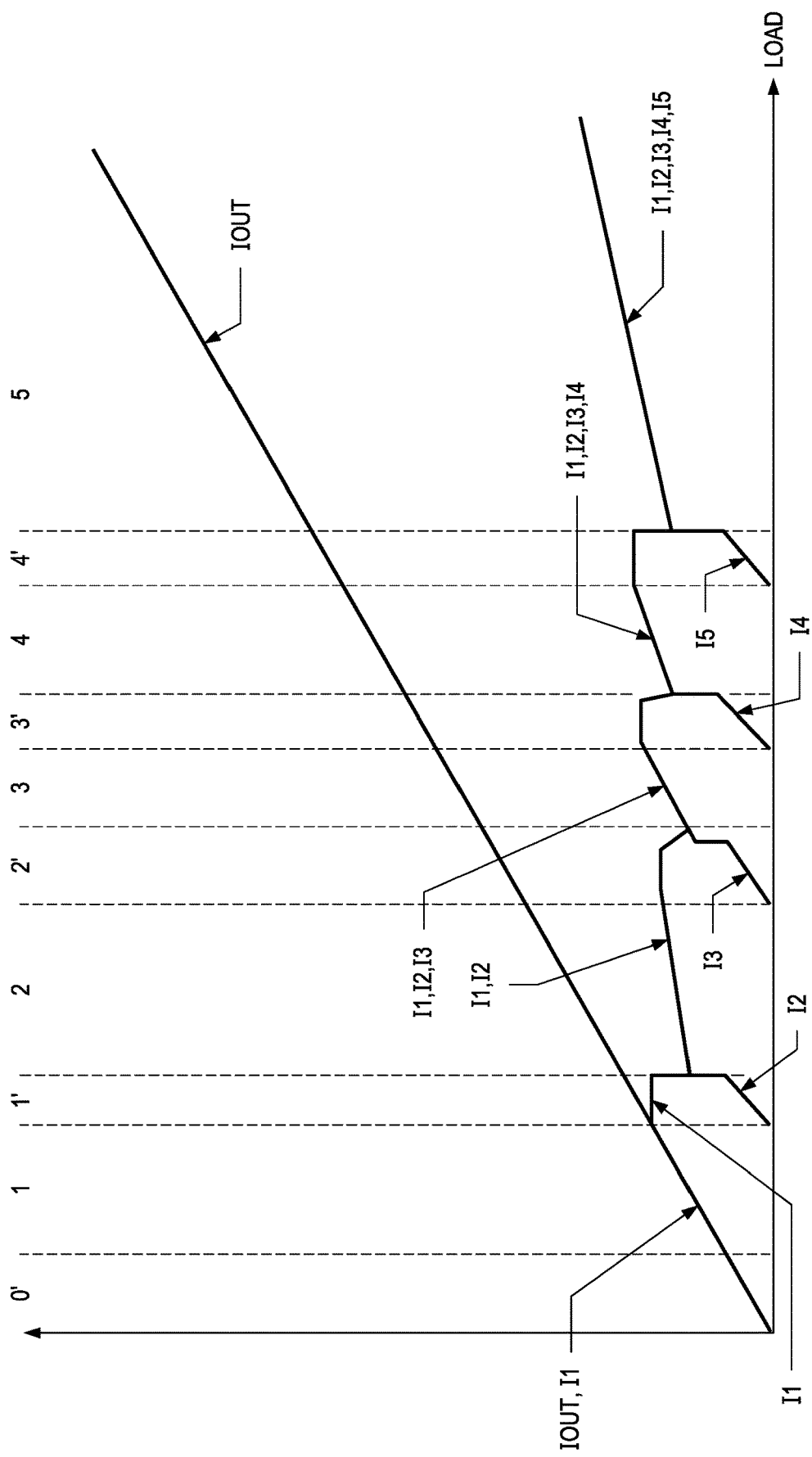

FIGS. 4A and 4B illustrate example currents generated by individual voltage regulator phases 114 for various operational modes of a power system 110, in accordance with embodiments of the present disclosure. FIG. 4A illustrates a graph of total current $I_{OUT}$ generated by power system 110 and currents of individual voltage regulator phases 114 versus output load across various operational phases of power system 110 in accordance with the example of FIG. 3. FIG. 4B is a blown up version of FIG. 4A showing detail of the graph for operational mode 1'. In the embodiments represented by FIGS. 4A and 4B, for ranges of total current $I_{OUT}$ in which at least one voltage regulator phase 114 is in the fully-enabled mode and a voltage regulator phase 114 is in the light-load mode (e.g., modes 1', 2', 3', and 4'), individual currents generated by fully-enabled voltage regulator phases 114 may remain constant over such ranges, while the light-load mode voltage regulator phase 114 may vary over such ranges, such that any variance in total current $I_{OUT}$ in such ranges (e.g., modes 1', 2', 3', and 4'), is handled by changing the individual current generated by the light-load mode voltage regulator phase 114.

Figure 5A:
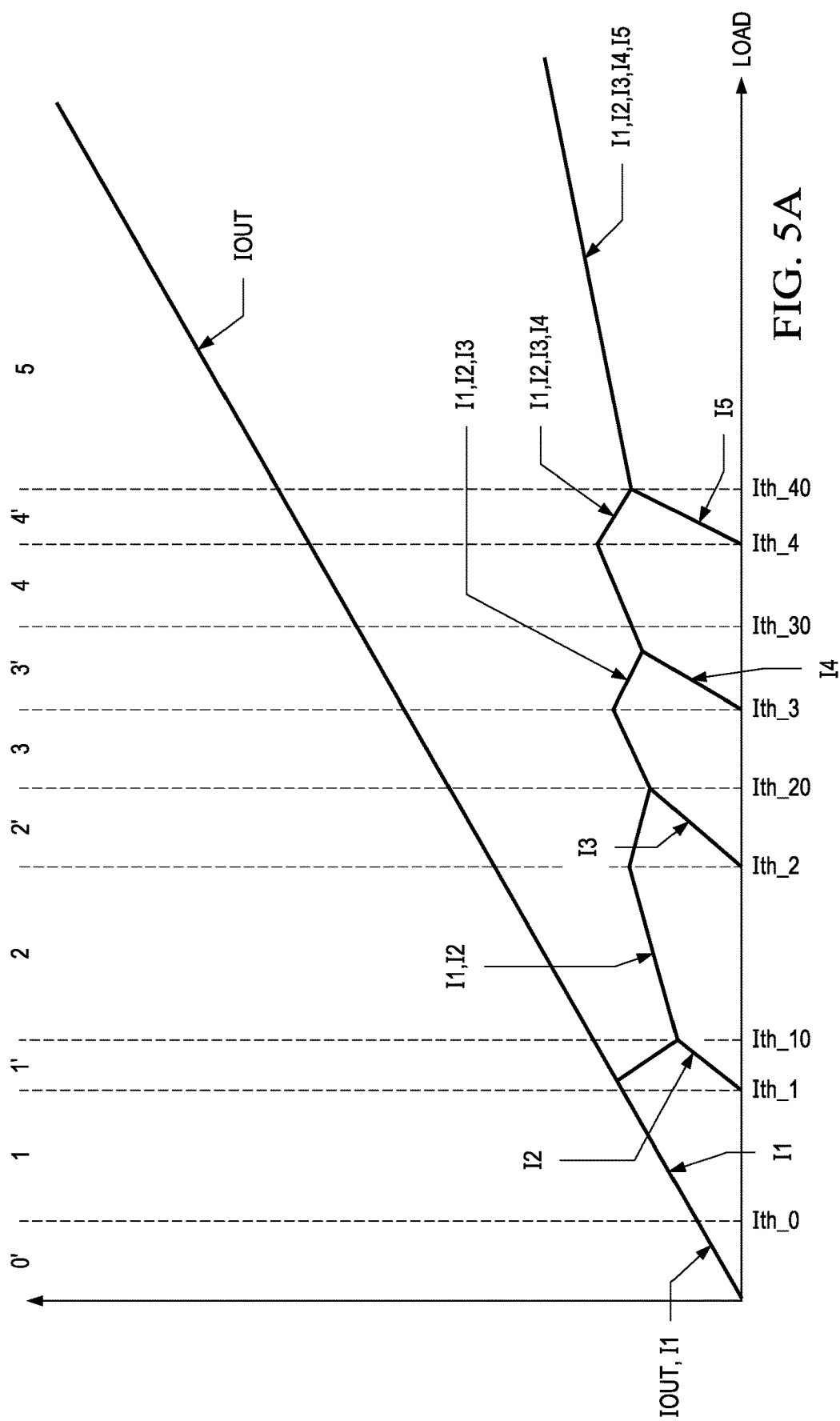
FIGS. 5A and 5B illustrate example currents generated by individual voltage regulator phases for various operational modes of a power system, in accordance with embodiments of the present disclosure.
Figure 5B:
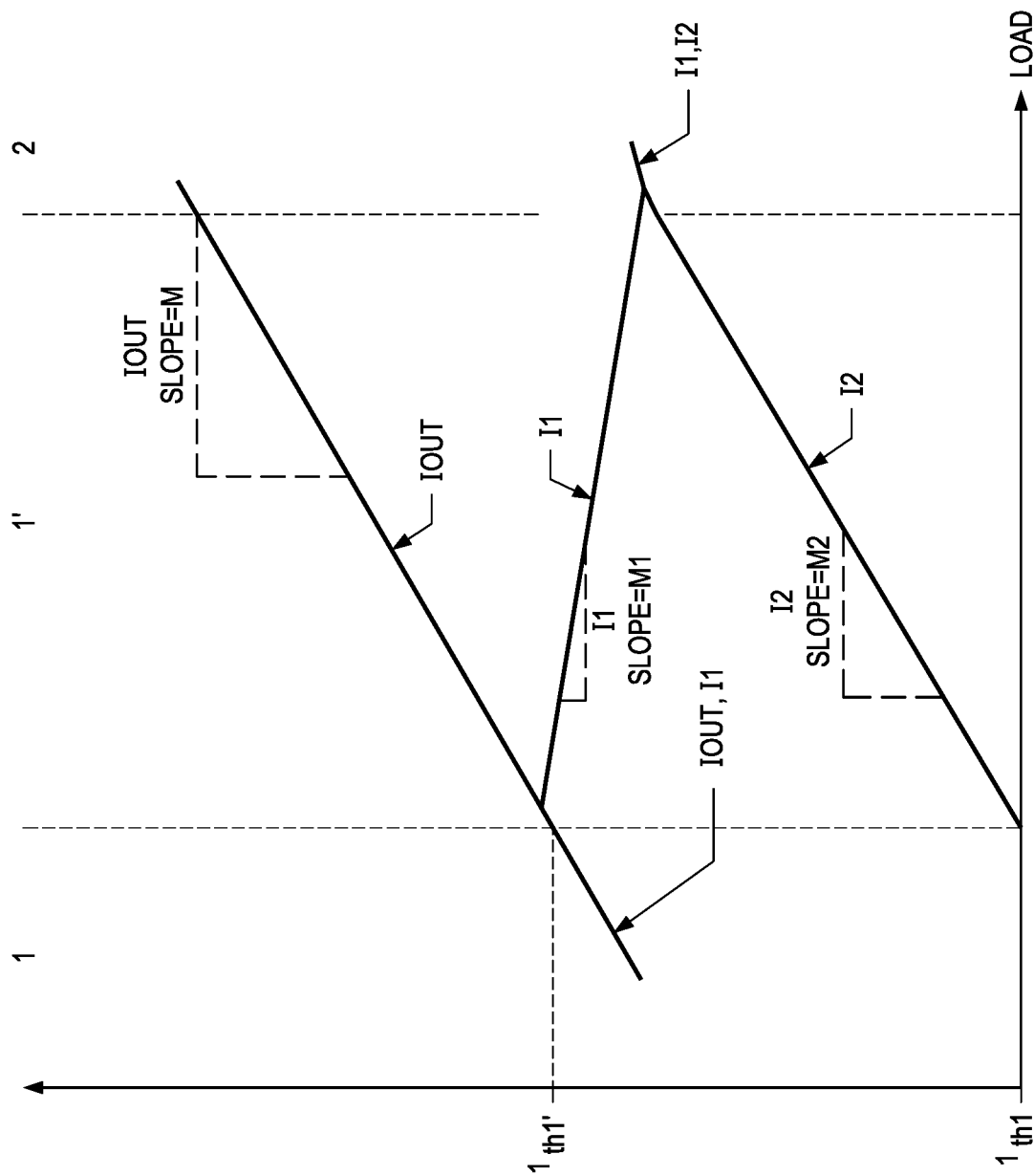

FIGS. 5A and 5B illustrate example currents generated by individual voltage regulator phases 114 for various operational modes of a power system 110, in accordance with embodiments of the present disclosure. FIG. 5A illustrates a graph of total current $I_{OUT}$ generated by power system 110 and currents of individual voltage regulator phases 114 versus output load across various operational phases of power system 110 in accordance with the example of FIG. 3. FIG. 5B is a blown up version of FIG. 5A showing detail of the graph for operational mode 1'. In the embodiments represented by FIGS. 5A and 5B, for ranges of total current $I_{OUT}$ in which at least one voltage regulator phase 114 is in the fully-enabled mode and a voltage regulator phase 114 is in the light-load mode (e.g., modes 1', 2', 3', and 4'), individual currents generated by fully-enabled voltage regulator phases 114 may decrease relative to increasing total current $I_{OUT}$ (and vice versa) over such ranges, while the light-load mode voltage regulator phase 114 may increase relative to increasing total current $I_{OUT}$ (and vice versa) over such ranges.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An information handling system comprising:
   at least one information handling resource; and
   a power system coupled to the at least one information handling resource, configured to provide electrical energy to the at least one information handling resource, and comprising a plurality of voltage regulator phases, wherein the power system is configured to:
      operate in a plurality of operational modes, each mode defining a number of the plurality of voltage regulator phases operating in a fully-enabled mode and whether or not one of the plurality of voltage regulator phases operates in a light-load mode, wherein:
         at least one of the plurality of operational modes comprises a mode in which one of the plurality of voltage regulator phases operates in a light-load mode and at least one of the plurality of voltage regulator phases operates in a fully-enabled mode; and
         a first current delivered by the voltage regulator phases operating in the light-load mode is smaller in magnitude than a second current delivered by an individual voltage regulator phase operating in the fully-enabled mode;
      select a selected operational mode from the plurality of operational modes based on a load requirement of the at least one information handling resource; and
      control the plurality of voltage regulator phases to deliver an aggregate current in accordance with the load requirement and the selected operational mode.

2. The information handling system of claim 1, wherein the power system is further configured to control the plurality of voltage regulator phases such that the individual currents delivered by the voltage regulator phase operating in the fully-enabled mode are approximately equal in magnitude.

3. The information handling system of claim 1, wherein each voltage regulator phase of the plurality of voltage regulator phases comprises:
   a driver stage for generating a pulse-modulated waveform; and
   a power stage for generating a current responsive to the pulse-modulated waveform.

4. The information handling system of claim 3, wherein:
   for a voltage regulator phase operating in the light-load mode, its respective driver stage generates a pulse-frequency modulated waveform; and
   for a voltage regulator phase operating in the fully-enabled mode, its respective driver stage generates a pulse-width modulated waveform.

5. The information handling system of claim 1, wherein the power system is further configured to, when operating in an operational mode in which one of the plurality of voltage regulator phases operates in the light-load mode, cause the voltage regulator phase operating in the light-load mode to increase the first current in response to an increase in a current of the load requirement and decrease the first current in response to a decrease in the current of the load requirement.

6. The information handling system of claim 5, wherein the power system is further configured to, when operating in an operational mode in which one of the plurality of voltage regulator phases operates in the light-load mode, cause each voltage regulator phase operating in the fully-enabled mode to decrease its respective second current in response to an increase in the current of the load requirement and increase its respective second current in response to a decrease in the current of the load requirement.

7. The information handling system of claim 5, wherein the power system is further configured to, when operating in an operational mode in which one of the plurality of voltage regulator phases operates in the light-load mode, cause each voltage regulator phase operating in the fully-enabled mode to maintain its respective second current substantially constant responsive to any change in the current of the load requirement.

8. A method comprising:
   operating a power system coupled to at least one information handling resource, configured to provide electrical energy to the at least one information handling resource, and comprising a plurality of voltage regulator phases, in a plurality of operational modes, each mode defining a number of the plurality of voltage regulator phases operating in a fully-enabled mode and whether or not one of the plurality of voltage regulator phases operates in a light-load mode, wherein:
      at least one of the plurality of operational modes comprises a mode in which one of the plurality of voltage regulator phases operates in a light-load mode and at least one of the plurality of voltage regulator phases operates in a fully-enabled mode; and
      a first current delivered by the voltage regulator phases operating in the light-load mode is smaller in magnitude than a second current delivered by an individual voltage regulator phase operating in the fully-enabled mode;
   selecting a selected operational mode from the plurality of operational modes based on a load requirement of the at least one information handling resource; and
   controlling the plurality of voltage regulator phases to deliver an aggregate current in accordance with the load requirement and the selected operational mode.

9. The method of claim 8, further comprising controlling the plurality of voltage regulator phases such that the individual currents delivered by the voltage regulator phase operating in the fully-enabled mode are approximately equal in magnitude.

10. The method of claim 8, wherein each voltage regulator phase of the plurality of voltage regulator phases comprises:
    a driver stage for generating a pulse-modulated waveform; and
    a power stage for generating a current responsive to the pulse-modulated waveform.

11. The method of claim 10, further comprising:
    for a voltage regulator phase operating in the light-load mode, generating a pulse-frequency modulated waveform from its driver stage; and
    for a voltage regulator phase operating in the fully-enabled mode, generating a pulse-width modulated waveform from its driver stage.

12. The method of claim 8, further comprising, when operating in an operational mode in which one of the plurality of voltage regulator phases operates in the light-load mode, causing the voltage regulator phase operating in the light-load mode to increase the first current in response to an increase in a current of the load requirement and decrease the first current in response to a decrease in the current of the load requirement.

13. The method of claim 12, further comprising, when operating in an operational mode in which one of the plurality of voltage regulator phases operates in the light-load mode, causing each voltage regulator phase operating in the fully-enabled mode to decrease its respective second current in response to an increase in the current of the load requirement and increase its respective second current in response to a decrease in the current of the load requirement.

14. The method of claim 12, further comprising, when operating in an operational mode in which one of the plurality of voltage regulator phases operates in the light-load mode, causing each voltage regulator phase operating in the fully-enabled mode to maintain its respective second current substantially constant responsive to any change in the current of the load requirement.

15. A power system comprising:
a plurality of voltage regulator phases; and
a controller configured to:
  operate the power system in a plurality of operational modes, each mode defining a number of the plurality of voltage regulator phases operating in a fully-enabled mode and whether or not one of the plurality of voltage regulator phases operates in a light-load mode, wherein:
    at least one of the plurality of operational modes comprises a mode in which one of the plurality of voltage regulator phases operates in a light-load mode and at least one of the plurality of voltage regulator phases operates in a fully-enabled mode; and
    a first current delivered by the voltage regulator phases operating in the light-load mode is smaller in magnitude than a second current delivered by an individual voltage regulator phase operating in the fully-enabled mode;
  select a selected operational mode from the plurality of operational modes based on a load requirement for the plurality of voltage regulator phases; and
  control the plurality of voltage regulator phases to deliver an aggregate current in accordance with the load requirement and the selected operational mode.

16. The power system of claim 15, wherein the controller is further configured to control the plurality of voltage regulator phases such that the individual currents delivered by the voltage regulator phase operating in the fully-enabled mode are approximately equal in magnitude.

17. The power system of claim 15, wherein each voltage regulator phase of the plurality of voltage regulator phases comprises:
  a driver stage for generating a pulse-modulated waveform; and
  a power stage for generating a current responsive to the pulse-modulated waveform.

18. The power system of claim 17, wherein:
  for a voltage regulator phase operating in the light-load mode, its respective driver stage generates a pulse-frequency modulated waveform; and
  for a voltage regulator phase operating in the fully-enabled mode, its respective driver stage generates a pulse-width modulated waveform.

19. The power system of claim 15, wherein the controller is further configured to, when operating in an operational mode in which one of the plurality of voltage regulator phases operates in the light-load mode, cause the voltage regulator phase operating in the light-load mode to increase the first current in response to an increase in a current of the load requirement and decrease the first current in response to a decrease in the current of the load requirement.

20. The power system of claim 19, wherein the controller is further configured to, when operating in an operational mode in which one of the plurality of voltage regulator phases operates in the light-load mode, cause each voltage regulator phase operating in the fully-enabled mode to decrease its respective second current in response to an increase in the current of the load requirement and increase its respective second current in response to a decrease in the current of the load requirement.

21. The power system of claim 19, wherein the controller is further configured to, when operating in an operational mode in which one of the plurality of voltage regulator phases operates in the light-load mode, cause each voltage regulator phase operating in the fully-enabled mode to maintain its respective second current substantially constant responsive to any change in the current of the load requirement.

* * * * *